United States Patent
Park et al.

(10) Patent No.: US 10,076,038 B2
(45) Date of Patent: Sep. 11, 2018

(54) PRINTED CIRCUIT BOARD AND MANUFACTURING METHOD THEREOF

(71) Applicant: SAMSUNG ELECTRO-MECHANICS CO., LTD., Suwon-Si, Gyeonggi-Do (KR)

(72) Inventors: Jung Hyun Park, Suwon-Si (KR); Yong Ho Baek, Suwon-Si (KR); Jae Hoon Choi, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/794,632

(22) Filed: Jul. 8, 2015

(65) Prior Publication Data

US 2016/0044788 A1 Feb. 11, 2016

(30) Foreign Application Priority Data

Aug. 11, 2014 (KR) .................. 10-2014-0103893

(51) Int. Cl.
*H05K 1/18* (2006.01)
*H05K 3/46* (2006.01)

(52) U.S. Cl.
CPC ........... *H05K 1/185* (2013.01); *H05K 3/4682* (2013.01); *H05K 2201/0195* (2013.01); *H05K 2203/1469* (2013.01)

(58) Field of Classification Search
CPC .......................................... H05K 2201/10287
USPC ........................................................ 174/251
See application file for complete search history.

(56) References Cited

U.S. PATENT DOCUMENTS

2009/0084596 A1* 4/2009 Inoue ................. H01L 24/24
174/261
2010/0159234 A1* 6/2010 Bae ................... C08G 18/4238
428/327

FOREIGN PATENT DOCUMENTS

| CN | 101653053 A | 2/2010 |
| JP | 2008-160144 A | 7/2008 |
| JP | 2009-81423 A | 4/2009 |
| KR | 10-2010-0041993 A | 4/2010 |

OTHER PUBLICATIONS

Chinese Office Action dated Sep. 12, 2017 in corresponding Chinese Patent Application No. 201510431524.0 (9 pages with English abstract).

\* cited by examiner

*Primary Examiner* — Hoa C Nguyen
*Assistant Examiner* — Stanley Tso
(74) *Attorney, Agent, or Firm* — NSIP Law

(57) ABSTRACT

There is provided a printed circuit board including: a first insulating layer; a first circuit pattern formed on a first surface of the first insulating layer; an adhesive layer provided on a second surface of the first insulating layer; and an electronic component disposed on the adhesive layer and enclosed by the first insulating layer and a second insulating layer formed on the first insulating layer.

6 Claims, 8 Drawing Sheets

PRINTED CIRCUIT BOARD AND MANUFACTURING METHOD THEREOF

CROSS-REFERENCE TO RELATED APPLICATION

This application claims the priority and benefit of Korean Patent Application No. 10-2014-0103893 filed on Aug. 11, 2014, with the Korean Intellectual Property Office, the disclosure of which is incorporated herein by reference.

BACKGROUND

The present disclosure relates to a printed circuit board and a manufacturing method thereof.

Requirements for high performance, miniaturization, and thinness of electronic products have increased in accordance with the development of the electronics industry. In order to cope with such requirements, circuit patterns have been highly densified and printed circuit boards in which electronic components are embedded have been increasingly used.

RELATED ART DOCUMENT (Patent Document 1) Japanese Patent Laid-Open Publication No. 2009-081423

SUMMARY

An aspect of the present disclosure may provide a printed circuit board enclosing an electronic component having a structure capable of implementing a fine circuit and thinness, and a manufacturing method thereof.

According to an aspect of the present disclosure, a printed circuit board may include: a first insulating layer; a first circuit pattern formed on a first surface of the first insulating layer; an adhesive layer provided on a second surface of the first insulating layer; and an electronic component disposed on the adhesive layer and enclosed by the first insulating layer and a second insulating layer formed on the first insulating layer.

The first circuit pattern may be enclosed in the first insulating layer so that one surface of the first circuit pattern is exposed to the first surface of the first insulating layer.

The printed circuit board may have a coreless structure that does not include a core layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
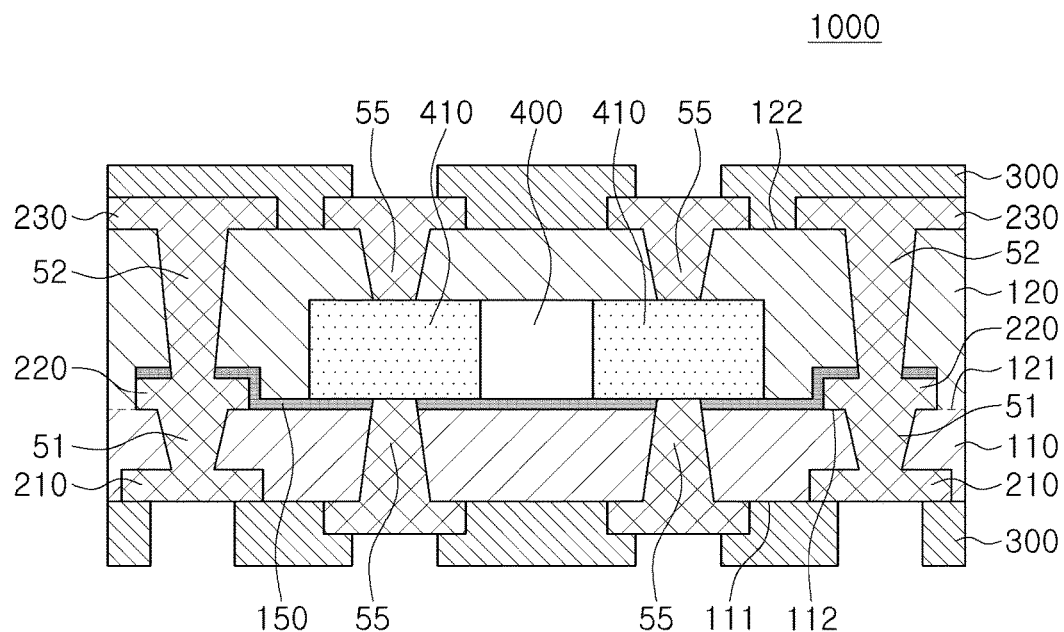
FIG. 1 is a cross-sectional view showing a structure of a printed circuit board according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Printed Circuit Board

FIG. 1 is a cross-sectional view showing a structure of a printed circuit board according to an exemplary embodiment of the present disclosure.

Referring to FIG. 1, a printed circuit board 1000 according to an exemplary embodiment of the present disclosure may include a first insulating layer 110 having a first surface 111 and a second surface 112 facing each other, a first circuit pattern 210 formed on the first surface 111 of the first insulating layer 110, an adhesive layer 150 stacked on the second surface 112 of the first insulating layer 110, and an electronic component 400 disposed on the adhesive layer 150 and enclosed by the first insulating layer 110 and a second insulating layer 120 formed on the first insulating layer 110.

According to the related art, in the case in which the electronic component is embedded in the printed circuit board, a method of forming a cavity in a core layer such as a copper clad laminate (CCL), inserting an electronic component into the cavity, and then stacking insulating layers on both surfaces of the core layer, to fix the inserted electronic component has been generally used.

However, in case of using the method according to the related art, since the core layer needs to have a thickness equal to or thicker than a thickness of the inserted electronic component and the insulating layers are stacked on both surfaces of the core layer, there is a limit in thinning the printed circuit board.

Therefore, according to an exemplary embodiment of the present disclosure, the electronic component may be embedded in a coreless structure that does not include the core layer, by forming the adhesive layer 150 on the first insulating layer 110, attaching and fixing the electronic component 400 onto the adhesive layer 150, and then stacking the second insulating layer 120. As a result, the printed circuit board enclosing the electronic component having a structure which is further thinned may be implemented.

Meanwhile, according to an exemplary embodiment of the present disclosure, the first circuit pattern 210 formed on the first surface of the first insulating layer 110 may be formed to be enclosed in the first insulating layer 110 so that one surface of the first circuit pattern 210 is exposed to the first surface 111 of the first insulating layer 110.

The first circuit pattern 210 is formed to be enclosed in the first insulating layer 110, whereby an interlayer high density connection of the circuit patterns may be performed and a finer circuit may be implemented.

As the first insulating layer 110 and the second insulating layer 120, a resin insulating layer may be used. As materials of the resin insulating layer, a thermosetting resin such as an epoxy resin, a thermoplastic resin such as polyimide, a resin having a reinforcement material such as glass fiber or inorganic filler impregnated in them, for example, a prepreg may be used. However, the materials of the resin insulating layer are not particularly limited thereto.

The electronic component 400 may be attached to the adhesive layer 150 and may be enclosed by the first insulating layer 110 and the second insulating layer 120.

The adhesive layer 150 may be a film-type adhesive layer.

By using the film-type adhesive layer, a manufacturing process may be simplified, adhesion may be easily controlled, laser processability, or the like at the time of a via hole processing may be improved.

The electronic component 400 may be fixed by the adhesive layer 150 and be enclosed by the first insulating layer 110 and the second insulating layer 120, to be embedded in a coreless structure that does not include the core layer such as the copper clad laminate (CCL), or the like.

The embedded electronic component 400 may include external electrodes 410, and the first insulating layer 110 or the second insulating layer 120 may be provided with vias 55 for electronic component connection connected to the external electrodes 410 of the electronic component 400.

The vias 55 for electronic component connection may be formed to penetrate through the first insulating layer 110 or the second insulating layer 120 and may electrically connect the external electrodes 410 of the electronic component 400 to the circuit patterns formed in the printed circuit board.

The via for electronic component connection formed in the first insulating layer 110 among the vias 55 for electronic component connection may be formed to penetrate through the adhesive layer 150 and be connected to the external electrodes 410 of the electronic component 400.

A second circuit pattern 220 may be formed on the second surface 112 of the first insulating layer 110, and the first insulating layer 110 may be provided with first vias 51 formed to penetrate through the first insulating layer 110 and connecting the first circuit pattern 210 and the second circuit pattern 220.

The second insulating layer 120 may have a first surface 121 which is in contact with the first insulating layer 110 and a second surface 122 which is opposite to the first surface 121, and a third circuit pattern 230 may be formed on the second surface 122 of the second insulating layer 120.

The second insulating layer 120 may be provided with second vias 52 formed to penetrate through the second insulating layer 120 and connecting the second circuit pattern 220 and the third circuit pattern 230.

As materials of the first circuit pattern 210, the second circuit pattern 220, and the third circuit pattern 230, any material may be used without being limited as long as it is used as a conductive metal for circuit pattern. For example, copper (Cu) may be used.

The vias 55 for electronic component connection, the first vias 51, and the second vias 52 may be made of the same material as the circuit pattern. For example, copper (Cu) may be used, but the present disclosure is not limited thereto, and any material may be used without being limited as long as it is used as the conductive metal.

A solder resist 300 formed to expose the circuit pattern for external connection pad may be disposed on a surface of the printed circuit board.

Figure 2:
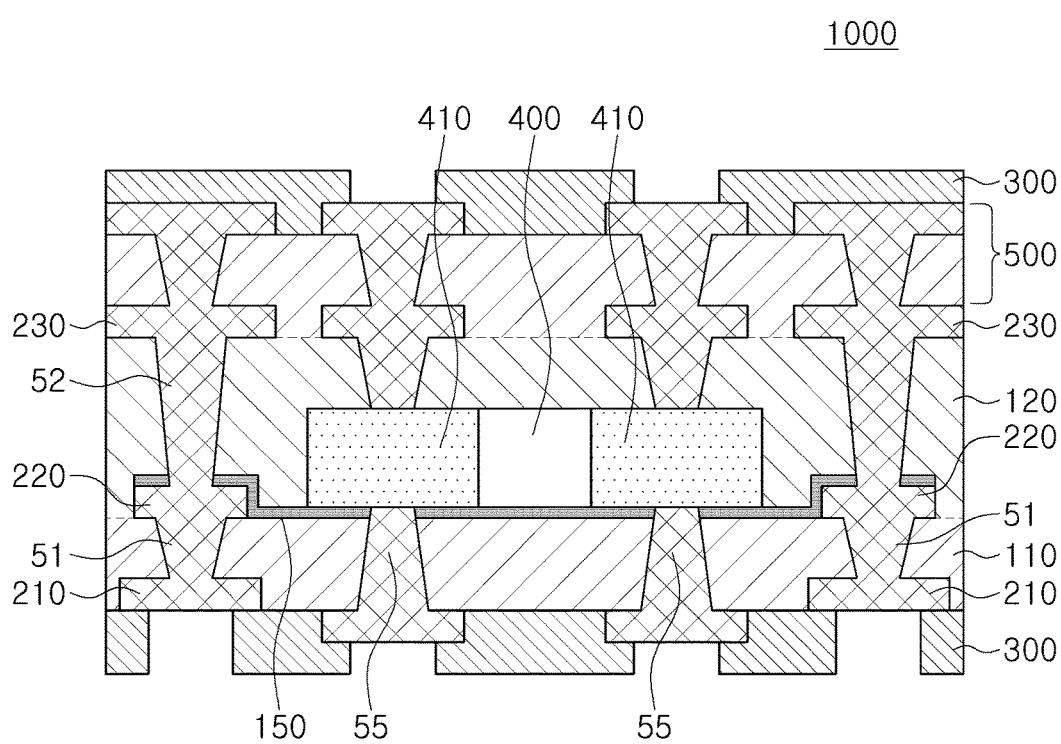
FIG. 2 is a cross-sectional view showing a structure of a printed circuit board according to another exemplary embodiment of the present disclosure.

FIG. 2 is a cross-sectional view showing a structure of a printed circuit board according to another exemplary embodiment of the present disclosure.

Referring to FIG. 2, in the printed circuit board according to an exemplary embodiment of the present disclosure, a build-up layer 500 may be further stacked on the second surface 122 of the second insulating layer 120.

In this case, although the build-up layer 500 stacked on the second surface 122 of the second insulating layer 120 is illustrated as one build-up layer in the FIG. 2, it is not limited thereto. For example, two or more build-up layers may be formed as long as they are formed within the range which may be utilized by those skilled in the art.

Manufacturing Method of Printed Circuit Board

FIGS. 3 through 17 are views sequentially showing a manufacturing method of a printed circuit board according to an exemplary embodiment of the present disclosure.

Figure 3:
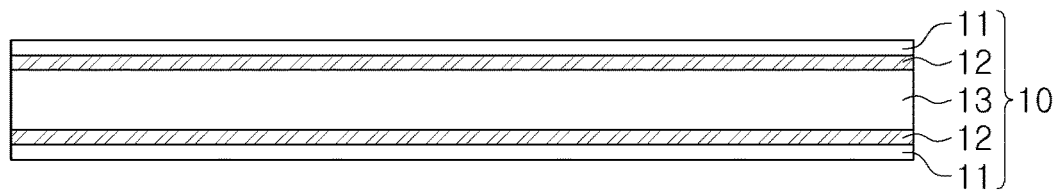
FIGS. 3 through 17 are views sequentially showing a manufacturing method of a printed circuit board according to an exemplary embodiment of the present disclosure.

Referring to FIG. 3, a carrier substrate 10 may be prepared.

The carrier substrate 10 may include a core part 13, inner layer metal plates 12 disposed on both surfaces of the core part 13, and outer layer metal plates 11 disposed on the inner layer metal plates 12.

The inner layer metal plates 12 and the outer layer metal plates 11 may be each copper (Cu) foil, but are not limited thereto.

At least one surface of bonding surfaces of the inner layer metal plates 12 and the outer layer metal plates 11 may be surface-treated so that the inner layer metal plates 12 and the outer layer metal plates 11 may be easily separated.

Figure 4:
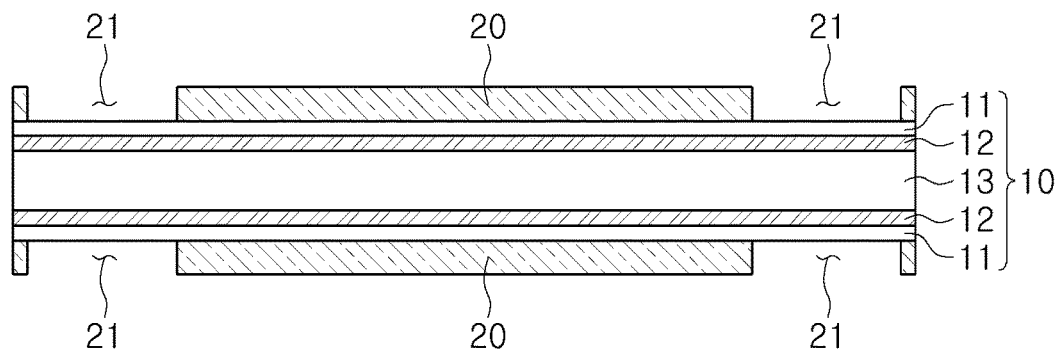

Referring to FIG. 4, first plating resists 20 having opening parts 21 for forming the first circuit patterns 210 may be formed on the outer layer metal plates 11.

As the first plating resist 20, which is a general photosensitive resist film, a dry film resist, or the like, may be used, but the present disclosure is not limited thereto.

The first plating resists 20 having the opening parts 21 may be formed by applying the photosensitive resist film, forming patterning mask, and then performing exposure and development processes.

Figure 5:
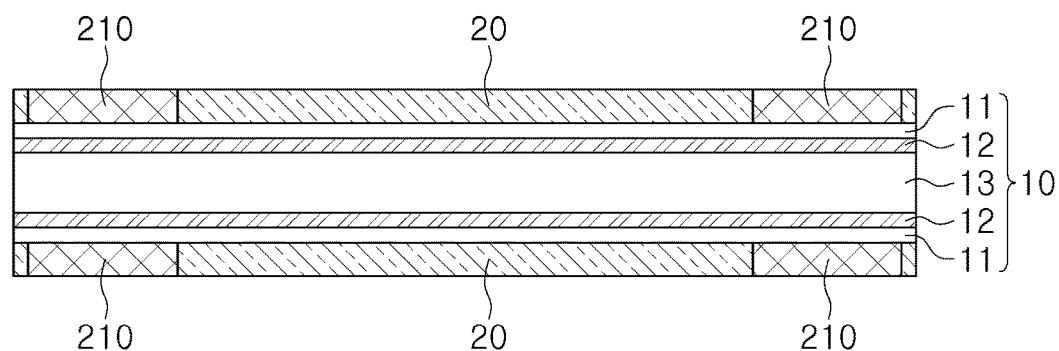

Referring to FIG. 5, the first circuit patterns 210 may be formed by filling the opening parts 21 with a conductive metal.

The filling of the conductive metal may be, for example, performed by using a process such as electroplating process, and the conductive metal may be used without being limited as long as it is a metal having excellent electric conductivity. For example, copper (Cu) may be used.

Figure 6:
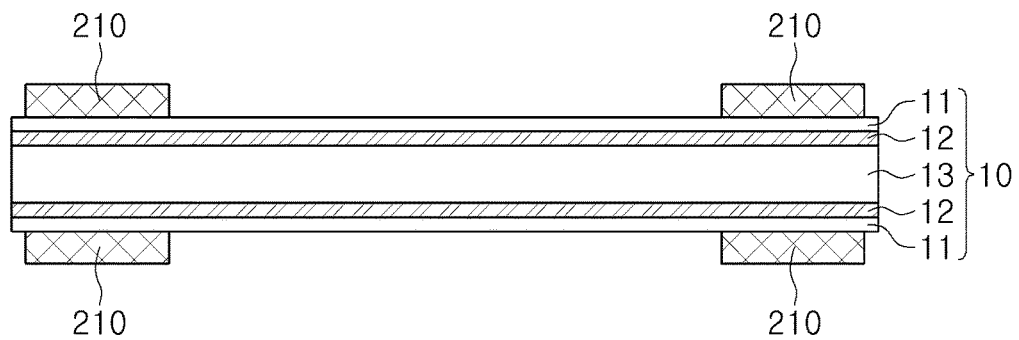

Referring to FIG. 6, the first plating resists 20 may be removed.

Figure 7:
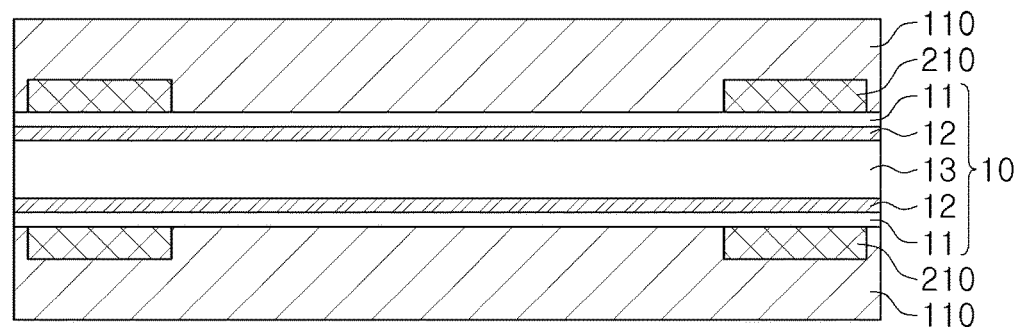

Referring to FIG. 7, first insulating layers 110 covering the first circuit patterns 210 may be formed on the outer layer metal plates 11 having the first circuit patterns 210 formed thereon.

As the first insulating layers 110, a resin insulating layer may be used. As materials of the resin insulating layer, a thermosetting resin such as an epoxy resin, a thermoplastic resin such as polyimide, a resin having a reinforcement material such as glass fiber or inorganic filler impregnated in them, for example, a prepreg may be used. However, the materials of the resin insulating layer are not particularly limited thereto.

Figure 8:
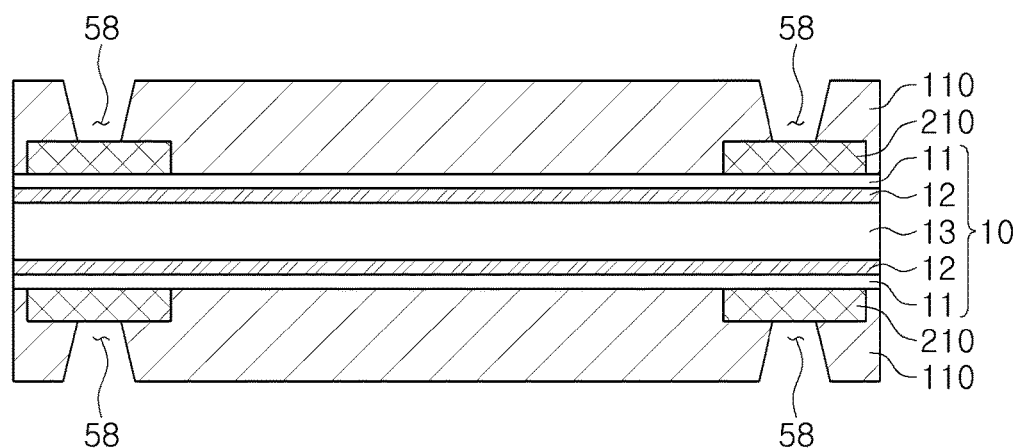

Referring to FIG. 8, via holes 58 may be formed in the first insulating layers 110 so that some of the first circuit patterns 210 are exposed.

Here, the via holes 58 may be formed by using a mechanical drill or a laser drill, but are not particularly limited thereto.

Here, the laser drill may be a $CO_2$ laser drill or a YAG laser drill, but is not particularly limited thereto.

Although the present drawing shows the case in which the via hole 58 has a tapered shape in which a diameter thereof is decreased in a downward direction, the via hole 58 may also have all shapes known in the related art, such as a tapered shape in which a diameter thereof is increased in the downward direction, a circular shape, and the like.

Figure 9:
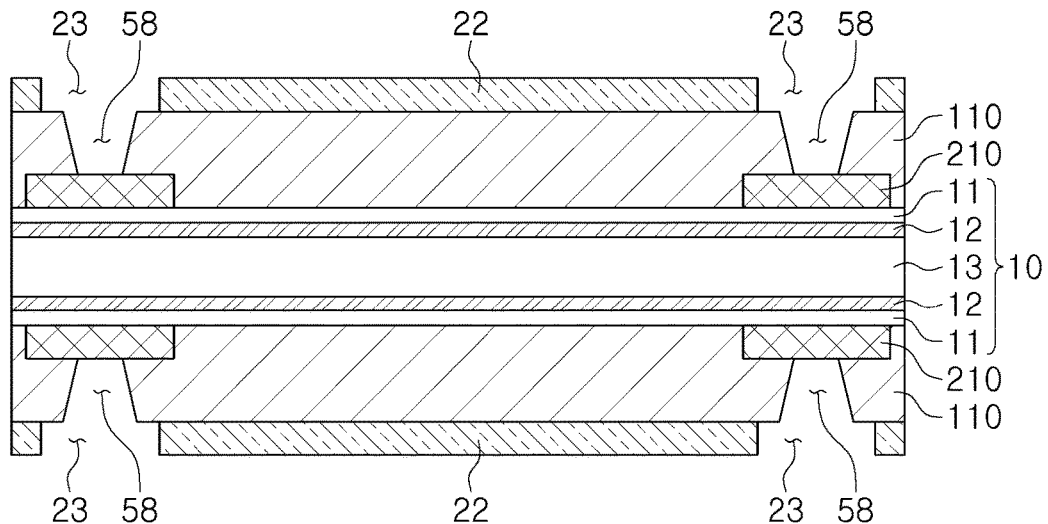

Referring to FIG. 9, second plating resists 22 having opening parts 23 for forming the second circuit patterns 220 may be formed on the first insulating layers 110.

Figure 10:
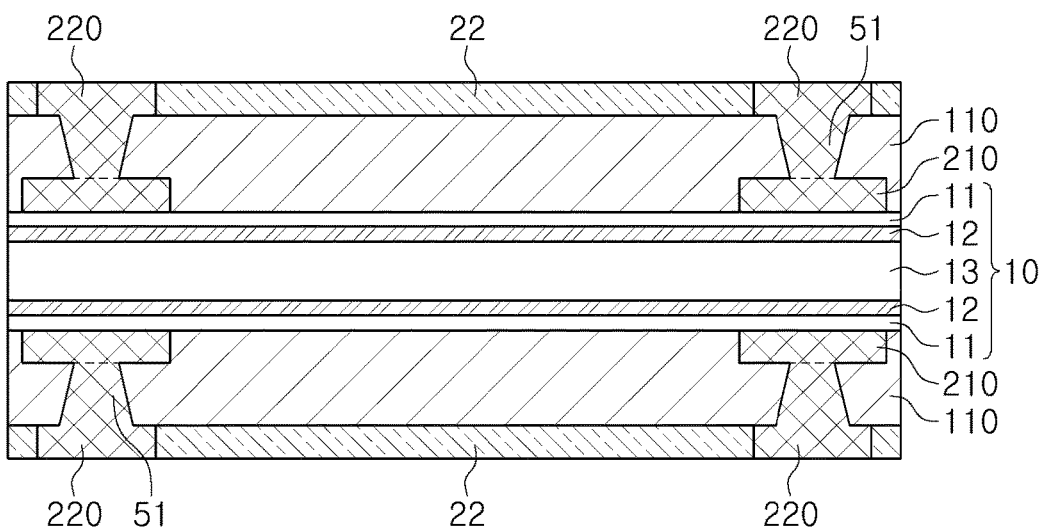

Referring to FIG. 10, first vias 51 may be formed by filling the via holes 58 and the second circuit patterns 220 may be formed by filling the opening parts 23.

The first vias 51 and the second circuit patterns 220 may be formed by performing an electroless plating process to form seed layers (not shown) and using a process such as the electroplating process, or the like to be filled with a conductive metal. The conductive metal may be used without being limited as long as it is a metal having excellent electric conductivity. For example, copper (Cu) may be used.

The first circuit pattern 210 and the second circuit pattern 220 may be electrically connected through the first vias 51.

Figure 11:
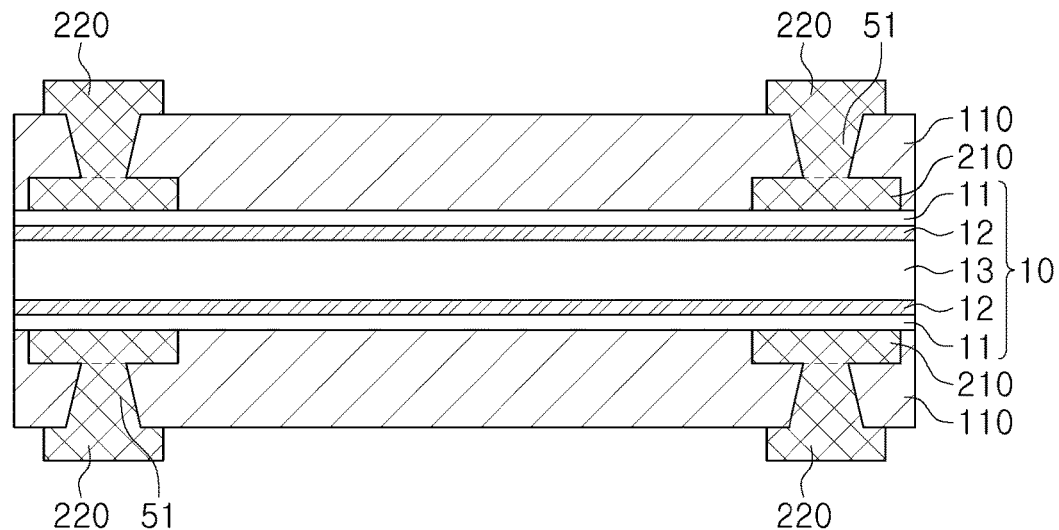

Referring to FIG. 11, after the second circuit patterns 220 are formed, the second plating resists 22 may be removed.

Figure 12:
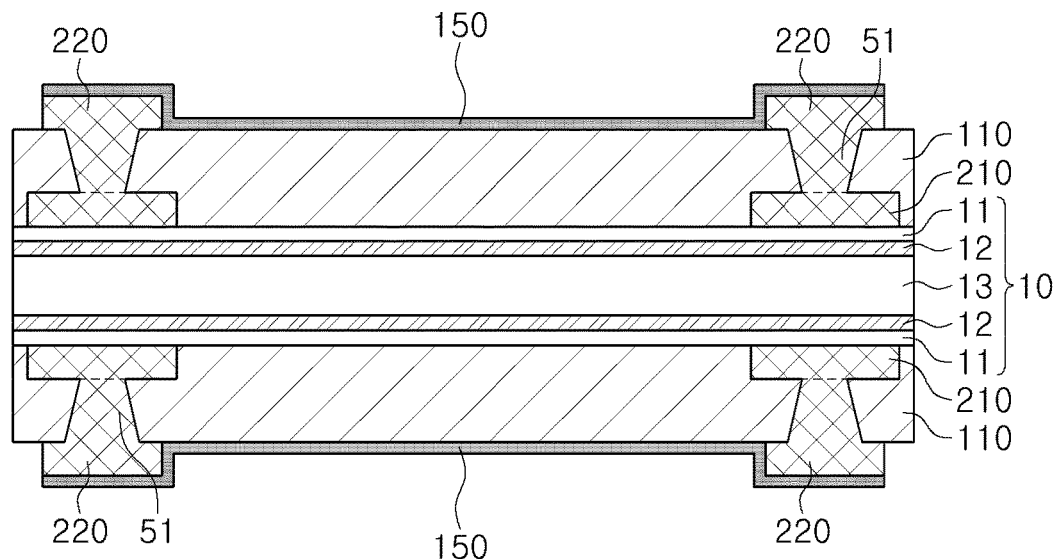

Referring to FIG. 12, adhesive layers 150 may be formed on the first insulating layers 110.

The adhesive layer 150 may be formed on some of the second circuit patterns 220 formed on the first insulating layers 110.

The adhesive layers 150 may be film-type adhesive layers.

By using a method of stacking the film-type adhesive layers, a manufacturing process may be simplified, adhesion may be easily controlled, laser processability, or the like at the time of a via hole processing may be improved.

Figure 13:
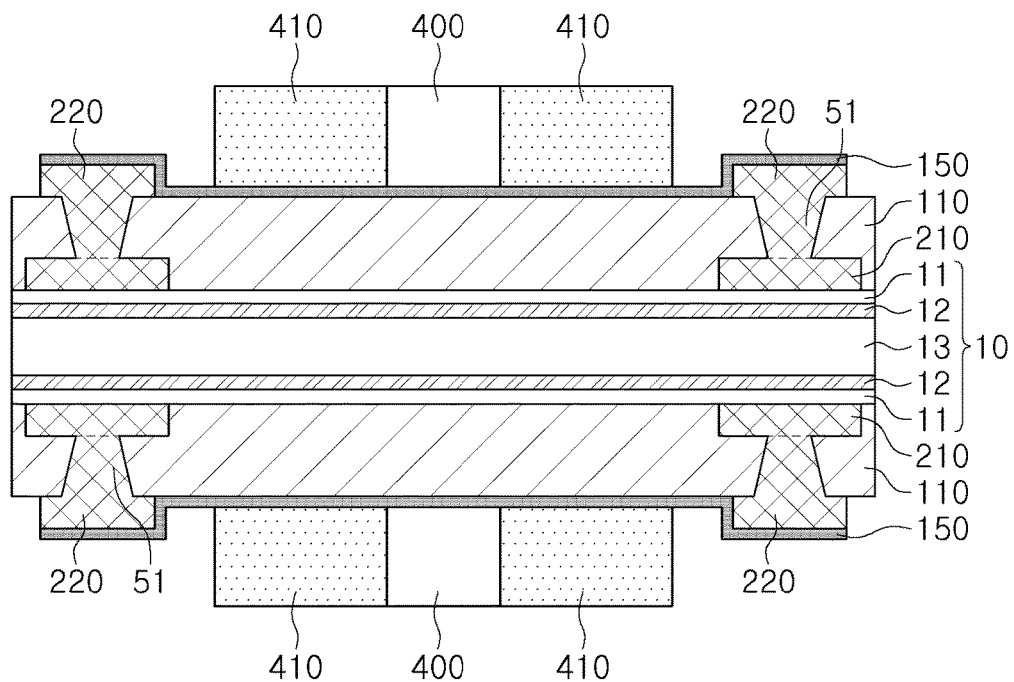

Referring to FIG. 13, electronic components 400 may be attached onto the adhesive layers 150.

The electronic components 400 may be attached and then fixed onto the adhesive layers 150.

Figure 14:
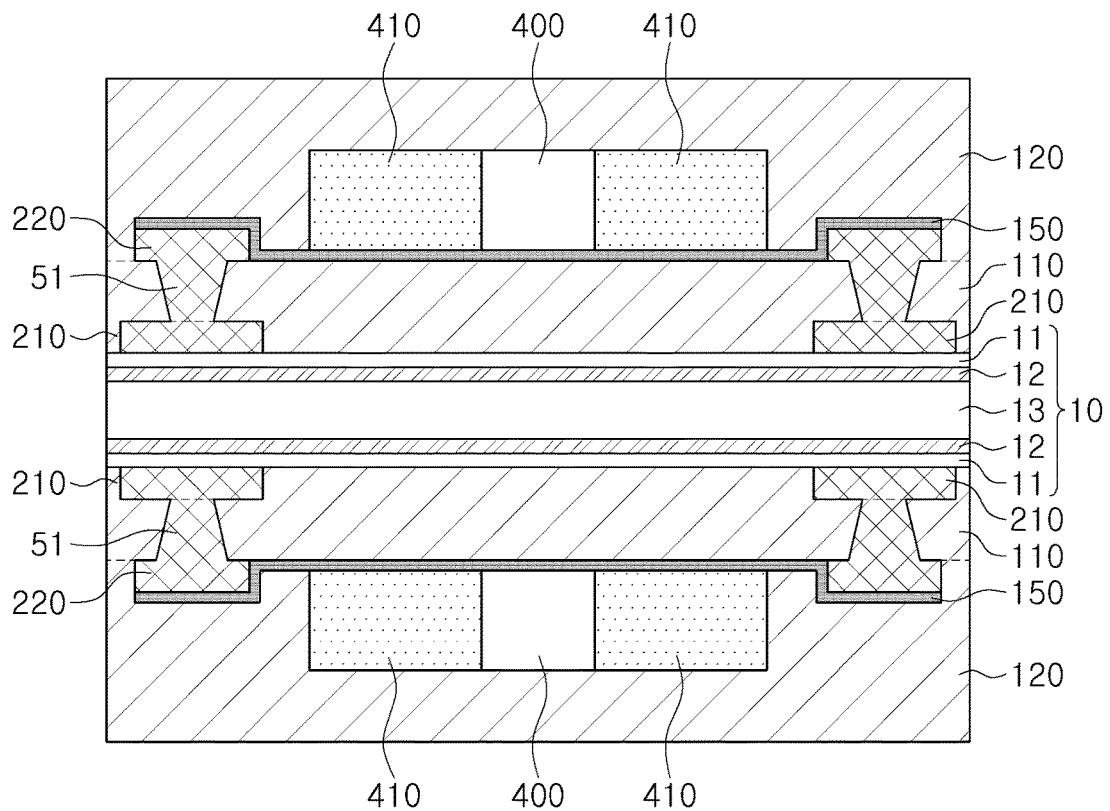

Referring to FIG. 14, second insulating layers 120 may be formed on the first insulating layers 110 to cover the electronic components 400.

As the second insulating layers 120, a resin insulating layer may be used. As materials of the resin insulating layer, a thermosetting resin such as an epoxy resin, a thermoplastic resin such as polyimide, a resin having a reinforcement material such as glass fiber or inorganic filler impregnated in them, for example, a prepreg may be used. However, the materials of the resin insulating layer are not particularly limited thereto.

The electronic components 400 may be enclosed by the first insulating layers 110 and the second insulating layers 120. As a result, the electronic components 400 may be embedded in a coreless structure that does not include the core layer such as a cooper clad laminate (CCL).

Figure 15:
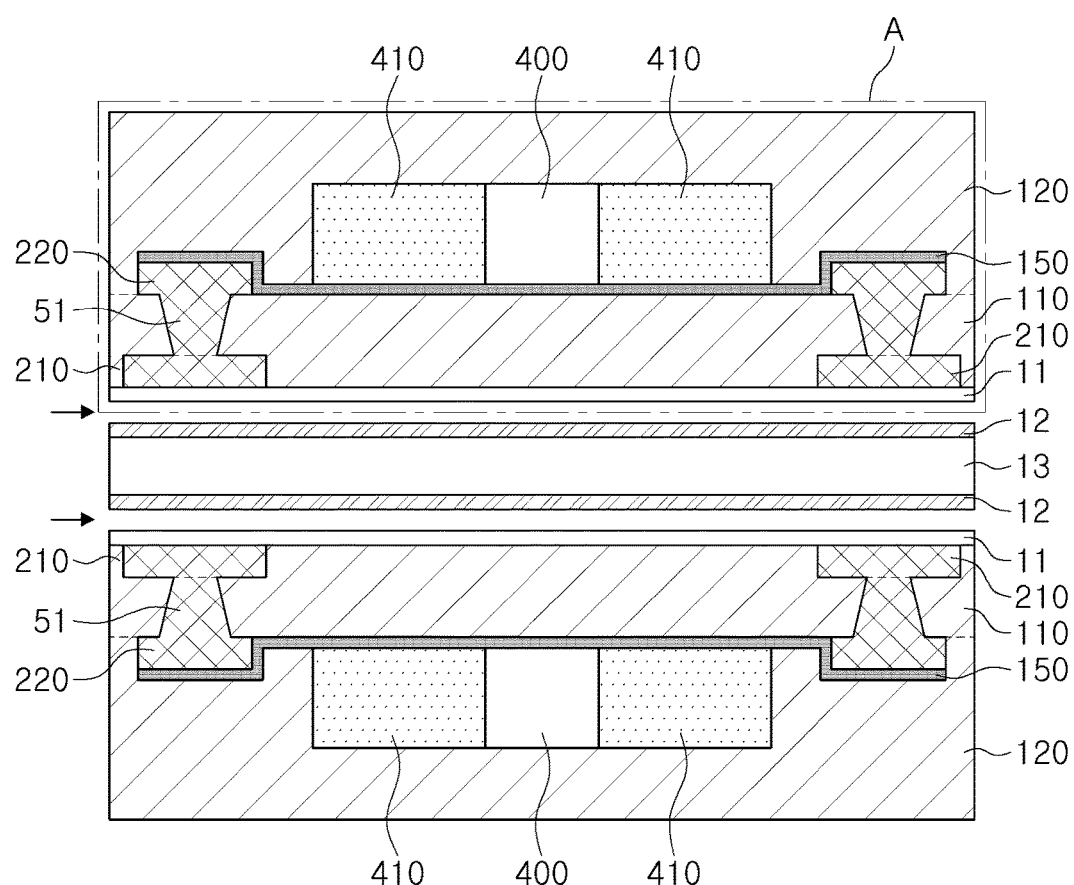

Referring to FIG. 15, the inner layer metal plates 12 and the outer layer metal plates 11 may be delaminated.

In this case, the inner layer metal plates 12 and the outer layer metal plates 11 may be delaminated by using a blade, but the present disclosure is not limited thereto and all method known in the art may be used.

In the delaminated printed circuit board A, the first circuit patterns 210 may be formed to be enclosed in the first insulating layers 110.

Figure 16:
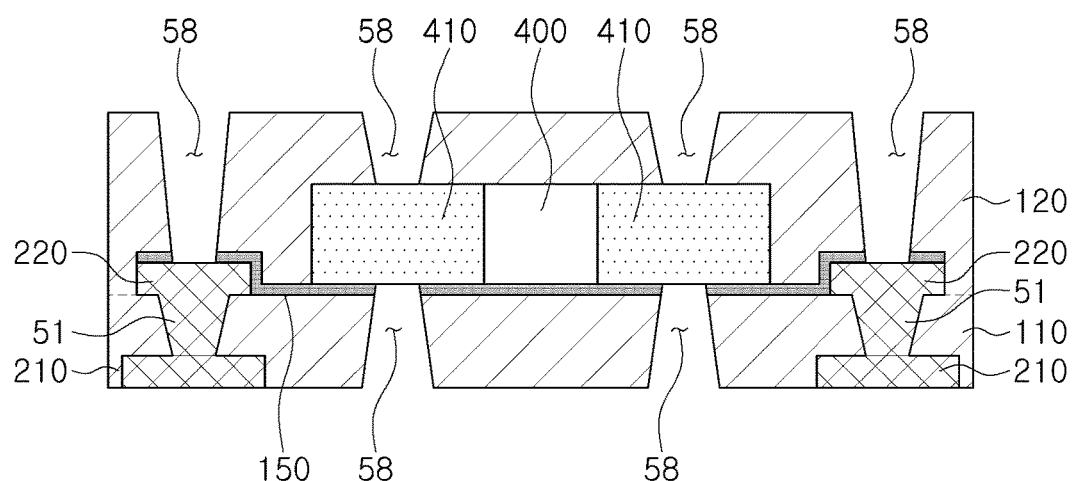

Referring to FIG. 16, via holes 58 may be formed in the first insulating layers 110 and the second insulating layers 120 of the delaminated printed circuit board A to expose external electrodes 410 of the electronic components 400.

The via holes formed in the first insulating layers 110 among the via holes 58 may be formed to penetrate through the adhesive layers 150 together with the first insulating layers 110, whereby the external electrodes 410 of the electronic component 400 may be exposed.

In addition, the via holes 58 may be formed in the second insulating layers 120 so that some of the second circuit patterns 220 are exposed.

Here, the via holes 58 may be formed by using a mechanical drill or a laser drill, and the laser drill may be a $CO_2$ laser drill or a YAG laser drill, but is not particularly limited thereto.

Figure 17:
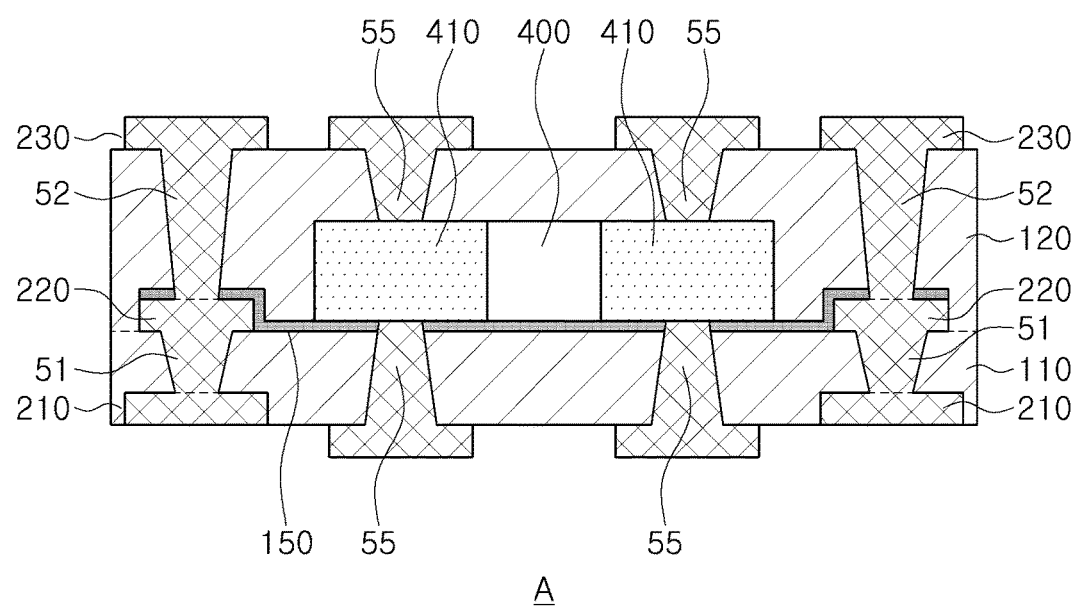

Referring to FIG. 17, vias 55 for electronic component connection and second vias 52 may be formed by filling the via holes 58 and third circuit patterns 230 may be formed on the second vias 52.

In this case, the vias 55 for electronic component connection, the second vias 52, and the third circuit patterns 230 may be formed by forming plating resists patterned to have opening parts on the second insulating layers 120 and then filling the via holes 58 and the opening parts with a conductive metal by using processes such as an electroless plating process, an electroplating process, and the like, similar to the process of forming the first vias 51 and the second circuit patterns 220.

The external electrodes 410 of the electronic components 400 and the circuit patterns formed on the printed circuit board may be electrically connected through the vias 55 for electronic component connection.

The second circuit patterns 220 and the third circuit patterns 230 may be electrically connected through the second vias 52.

In addition, build-up layers 500 may be formed on the second insulating layers 120 by repeating the processes of forming the second vias 52 and the third circuit patterns 230 (not shown). In this case the build-up layers which are stacked may be formed in two layers, three layers, four layers, or within the range which may be utilized by those skilled in the art.

Solder resists 300 may be formed on the surfaces of the printed circuit board A so that the circuit patterns for external connection pad are exposed.

As set forth above, according to exemplary embodiments of the present disclosure, the printed circuit board enclosing the electronic component having the structure capable of implementing the fine circuit and being further thinned may be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first insulating layer;
   a first circuit pattern layer formed at a first surface of the first insulating layer;
   an adhesive layer provided on a second surface of the first insulating layer;
   an electronic component disposed on the adhesive layer and enclosed by the first insulating layer and a second insulating layer formed on the first insulating layer; and
   a first via formed to penetrate through the first insulating layer and connected to the first circuit pattern layer,
   wherein the first circuit pattern layer comprises:
      a first circuit pattern enclosed in the first insulating layer in such a way that one surface of the first circuit pattern is exposed through the first surface of the first insulating layer and remaining surfaces of the first circuit pattern excluding the one surface of the first circuit pattern are covered by the first insulating layer; and a second circuit pattern spaced apart from the first circuit pattern and protruded from the first surface of the first insulating layer toward an opposite side of the first circuit pattern, wherein one end of the first via is in contact with the other surface of the first circuit pattern opposite to the one surface of the first circuit pattern, and wherein an interface is formed between the first via and the first circuit pattern.

2. The printed circuit board of claim 1, further comprising a via for electronic component connection penetrating through the first insulating layer or the second insulating layer to be connected to external electrodes of the electronic component.

3. The printed circuit board of claim 2, wherein the via for electronic component connection formed in the first insulating layer penetrates through the adhesive layer to be connected to the external electrodes of the electronic component.

4. The printed circuit board of claim 1, wherein the adhesive layer is a film-type adhesive layer.

5. The printed circuit board of claim 1, further comprising:

a second circuit pattern layer formed on the second surface of the first insulating layer and being in contact with the other end of the first via.

6. The printed circuit board of claim 5, further comprising:

a third circuit pattern layer formed on a second surface of the second insulating layer; and a second via formed to penetrate through the second insulating layer and connecting the second circuit pattern layer and the third circuit pattern layer to each other.

* * * * *